United States Patent
Chiang et al.

(10) Patent No.: US 12,400,873 B2
(45) Date of Patent: Aug. 26, 2025

(54) ETCHING METHODS FOR INTEGRATED CIRCUITS

(71) Applicant: Taiwan Semiconductor Manufacturing Company, Hsinchu (TW)

(72) Inventors: Chia-Yi Chiang, Hsinchu (TW); Chien-Sheng Wu, Hsinchu (TW); Chih-Hsien Hsu, Hsinchu (TW); Chia-Hao Chang, Taichung (TW); Tai-Pin Chuang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 712 days.

(21) Appl. No.: 17/680,681

(22) Filed: Feb. 25, 2022

(65) Prior Publication Data
US 2023/0049714 A1 Feb. 16, 2023

Related U.S. Application Data

(60) Provisional application No. 63/232,282, filed on Aug. 12, 2021.

(51) Int. Cl.
H01L 21/3213 (2006.01)
H01L 21/28 (2025.01)

(52) U.S. Cl.
CPC .. *H01L 21/32135* (2013.01); *H01L 21/28052* (2013.01)

(58) Field of Classification Search
CPC .................... H01L 21/32135; H01L 21/28052
See application file for complete search history.

(56) References Cited

U.S. PATENT DOCUMENTS

| | | | | |
|---|---|---|---|---|
| 6,037,265 A | * | 3/2000 | Mui | C09K 13/00 438/719 |
| 6,136,211 A | * | 10/2000 | Qian | H01L 21/02071 216/37 |
| 2007/0122959 A1 | * | 5/2007 | Lee | H10B 41/30 257/E27.103 |

* cited by examiner

*Primary Examiner* — Jay C Kim
*Assistant Examiner* — Woo K Lee
(74) *Attorney, Agent, or Firm* — Lippes Mathias LLP (57) ABSTRACT

A method for etching a tungsten silicide (WSix) layer during formation of a gate electrode in an integrated circuit is disclosed. The method uses an etchant gas comprising nitrogen gas ($N_2$) and oxygen gas ($O_2$) in a specified flow ratio. The etchant gas may also comprise chlorine gas ($Cl_2$) and tetrafluoromethane ($CF_4$). The selectivity of the etchant gas containing $O_2$ for WSix versus polysilicon is much higher, which reduces overetching and provides more control in methods for producing a gate electrode. A gate electrode produced by such a method is also disclosed.

20 Claims, 7 Drawing Sheets

ETCHING METHODS FOR INTEGRATED CIRCUITS

PRIORITY CLAIM AND CROSS-REFERENCE

This application claims priority to U.S. Provisional Patent Application Ser. No. 63/232,282, filed on Aug. 12, 2021, which is incorporated by reference in its entirety.

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to improvements in dry etching processes. Dry etching is a highly anisotropic process for obtaining high aspect ratios (i.e. predominantly vertical walls), and is commonly performed using plasma treatment. Very generally, plasma is produced by applying a radiofrequency (RF) electromagnetic field through a gas between two electrodes. The RF field ionizes the gas molecules and strips them of their electrons, creating a plasma. The ions bombard a wafer substrate which has a patterned photoresist layer thereon, removing the exposed material below the photoresist.

Continuing, polycrystalline silicon (polysilicon) is commonly used to form the gate electrode of a semiconductor, due to its having a very high melting point which is similar to that of the silicon substrate. However, polysilicon has high electrical resistance. Thus, tungsten silicide (WSix) is commonly deposited upon the polysilicon layer to increase electrical conductivity. The layers are then etched to form the gate electrode. The present disclosure improves the etching process for forming the gate electrode. FIGS. 1A-1D illustrate the etching process for forming the gate electrode.

Figure 1A:
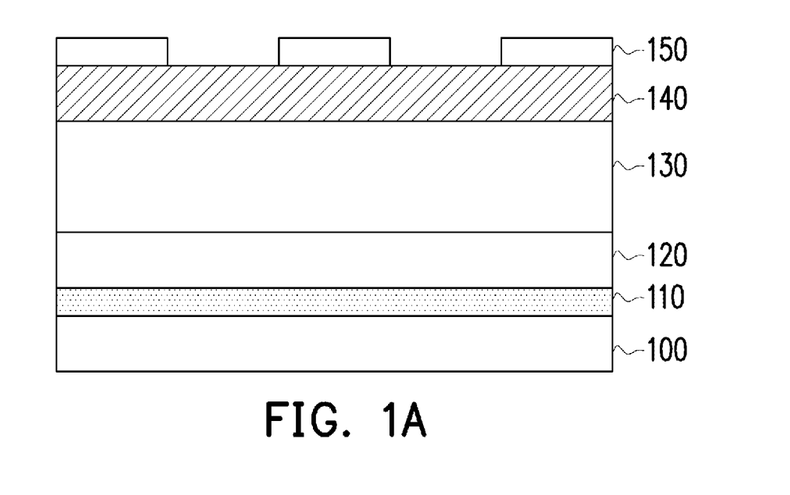
FIG. 1A is a first cross-sectional view illustrating a semiconducting wafer substrate with a gate oxide layer, polysilicon layer, tungsten silicide layer, and oxide capping layer thereon, in accordance with some embodiments.

FIG. 1A shows a semiconducting wafer substrate 100 with a gate oxide layer 110 thereon. The wafer substrate itself can be a wafer made of any semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), indium arsenide (InAs), and indium phosphide (InP).

The gate oxide layer can be grown by thermal oxidation of the substrate, for example at a temperature of about 850°

C. to about 950° C. in the presence of water or oxygen ($O_2$). Alternatively, the gate oxide layer can be formed by a chemical vapor deposition (CVD) process, for example using $O_2$ along with silane ($SiH_4$) or dichlorosilane ($SiH_2Cl_2$), or using tetraethyl orthosilicate (TEOS) at elevated temperatures above about 600° C. The gate oxide layer may have a thickness of about 32 angstroms to about 550 angstroms, depending on the desired application. In some particular embodiments, the gate oxide layer has a thickness of about 60 angstroms to about 120 angstroms. The gate oxide layer will separate the gate electrode from the source and drain electrodes. The gate oxide layer is typically very thin compared to the gate electrode.

A polysilicon layer 120 is present upon the gate oxide layer 110. The polysilicon layer may be formed using CVD or physical vapor deposition (PVD) sputtering methods. For example, $SiH_4$ can be decomposed at temperatures of about 500° C. to about 800° C. The polysilicon layer may have a thickness of about 500 angstroms to about 5000 angstroms. In some particular embodiments, the polysilicon layer has a thickness of about 900 angstroms to about 1100 angstroms.

A tungsten silicide (WSix) layer 130 is present upon the polysilicon layer 120 to increase electrical conductivity. The WSix layer is usually formed using CVD. Dichlorosilane ($SiH_2Cl_2$) and tungsten hexafluoride ($WF_6$) are typically used as the process gases. The reaction occurs at temperatures of about 500° C. to about 600° C. The deposited WSix may subsequently be annealed to increase the electrical conductivity of the layer. The WSix layer may have a thickness of about 1000 angstroms to about 5000 angstroms. In some particular embodiments, the WSix layer has a thickness of about 2200 angstroms to about 2800 angstroms. The WSix layer 130 should be thicker than the polysilicon layer 120.

Finally, an oxide capping layer 140 is present upon the WSix layer 130. The oxide capping layer may be formed using known methods. Usually, this oxide capping layer is formed by the decomposition of TEOS at temperatures of about 600° C. to about 650° C., or through plasma enhanced CVD at lower temperatures. The oxide capping layer may have any desired thickness, for example in a range of about 800 angstroms to about 2000 angstroms. In some particular embodiments, the oxide capping layer has a thickness of about 900 angstroms to about 1100 angstroms.

FIG. 1A also includes a photoresist (PR) layer 150 which has been formed and patterned upon the oxide capping layer 140. The PR layer is typically deposited using spin-coating, though other methods known in the art can also be used. The PR layer is patterned using conventional photolithographic processes.

Next, using either the PR layer 150 or the oxide capping layer 140 as a mask, the gate electrode is then formed by subsequently initiating dry etching of the oxide capping layer 140, the WSix layer 130, and the polysilicon layer 120. The etching process is typically performed in a plasma treatment tool using different process gases for each layer.

Figure 1B:
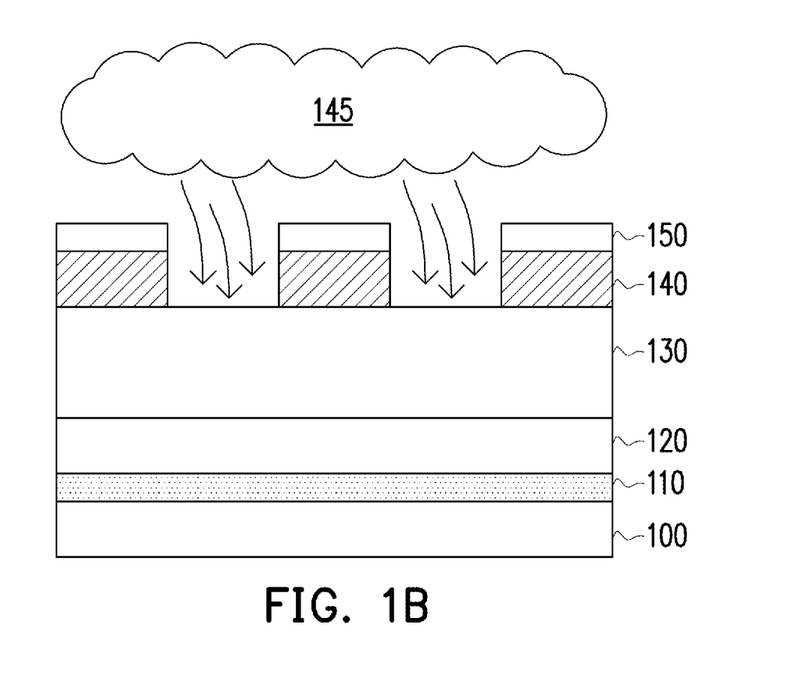
FIG. 1B illustrates the wafer substrate of FIG. 1A, with the oxide capping layer etched.

In FIG. 1B, the oxide capping layer 140 is etched, using the PR layer 150 as a mask. The etchant gas 145 for the oxide capping layer 140 may be made from a combination of gases such as $CF_4$, $CHF_3$, and $O_2$. The oxide capping layer acts as a hard mask for etching of the other layers.

Figure 1C:
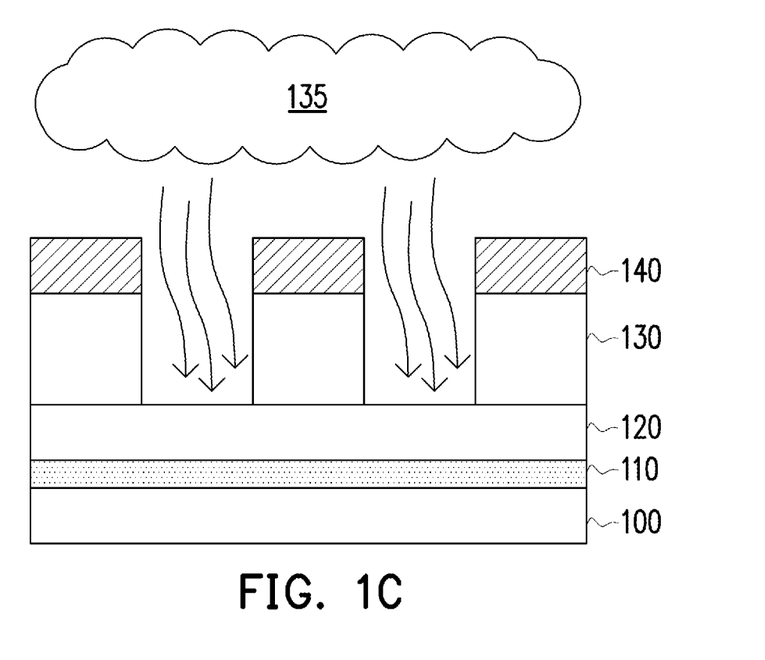
FIG. 1C illustrates the wafer substrate of FIG. 1B, with the WSix layer etched.

In FIG. 1C, the WSix layer 130 is subsequently etched. It is noted the PR layer is not present here, since it has been removed. In the methods of the present disclosure, the etchant gas 135 for the WSix layer 130 is made from a combination of $Cl_2$, $CF_4$, $N_2$, and $O_2$. More specifically, the etchant gas for the WSix layer comprise $N_2$ and $O_2$ gases in a flow ratio (i.e. volume ratio or molar ratio) of about 1.6:1 to about 2.4:1. Put another way, there is more $N_2$ gas than $O_2$ gas in the etchant gas. In more specific embodiments, the $N_2$:$O_2$ flow ratio is about 2:1.

Figure 1D:
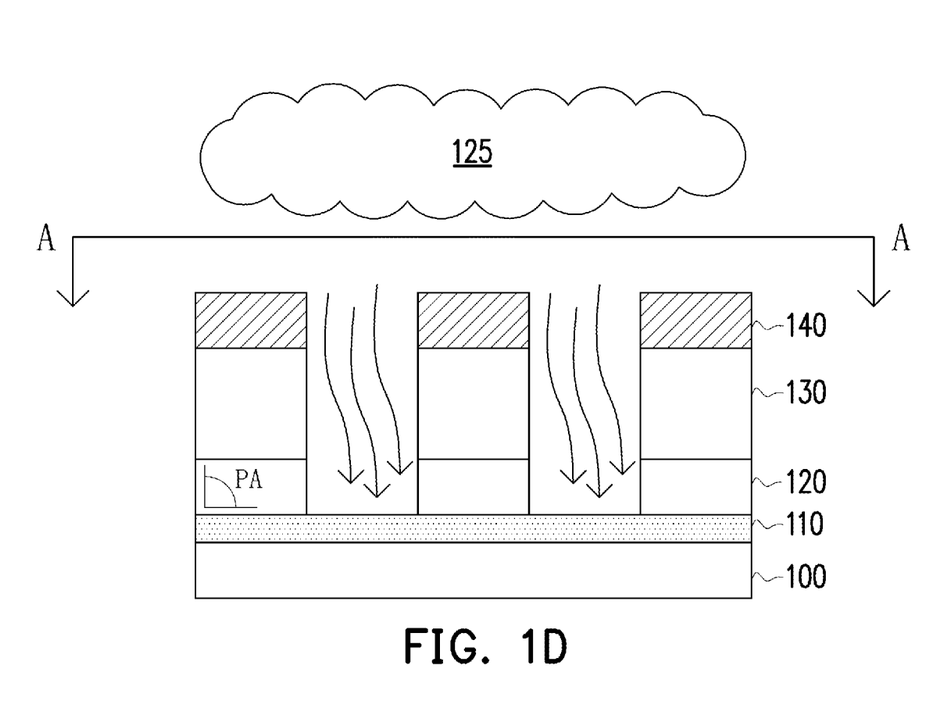
FIG. 1D illustrates the wafer substrate of FIG. 1C, with the polysilicon layer etched.
Figure 1E:
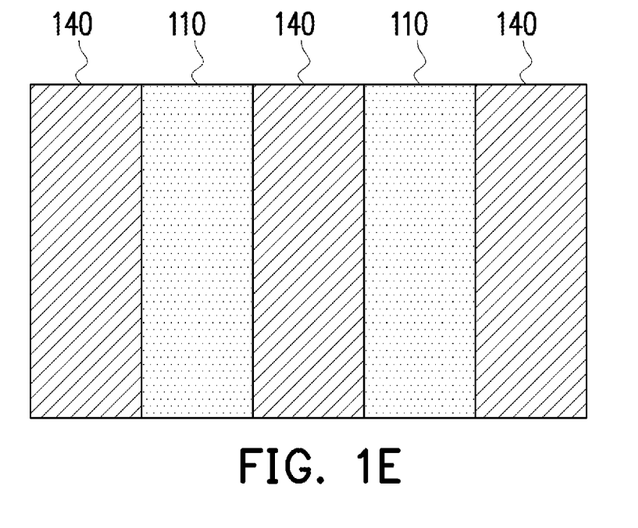
FIG. 1E is a plan view of the wafer substrate of FIG. 1D along line A-A.

In FIG. 1D, the polysilicon layer 120 is then etched. The etchant gas 125 for the polysilicon layer 120 is different from the etchant gas for the WSix layer. In particular embodiments, the polysilicon etchant gas is a combination of HBr, $Cl_2$, and $HeO_2$. In particular, nitrogen gas ($N_2$) and oxygen gas ($O_2$) are not used in the polysilicon etchant gas. A gate electrode is thus formed from the combination of the etched WSix layer 130 and the etched polysilicon layer 120. FIG. 1E is a plan view of the final structure, where the capping oxide layer 140 upon each gate electrode is visible, along with the gate oxide layer 110 between each electrode.

The internal profile angle of the polysilicon layer 120 relative to the gate oxide layer 110 is indicated as angle PA. Desirably, this angle is from about 88° to 90°.

After etching of the polysilicon layer 120, the gate oxide layer 110 desirably has a thickness of about 32 angstroms to about 550 angstroms, depending on the desired application. In some particular embodiments, the gate oxide layer has a thickness of about 60 angstroms to about 120 angstroms. As will be explained in further detail herein, the addition of $O_2$ to the etchant gas for the WSix layer reduces loss of the gate oxide layer due to overetching during the polysilicon etch step.

In some specific embodiments, the gate oxide layer has a thickness of about 60 angstroms to about 120 angstroms; the polysilicon layer has a thickness of about 900 angstroms to about 1100 angstroms; the WSix layer has a thickness of about 2200 angstroms to about 2800 angstroms; and the oxide capping layer has a thickness of about 900 angstroms to about 1100 angstroms.

Figure 2:
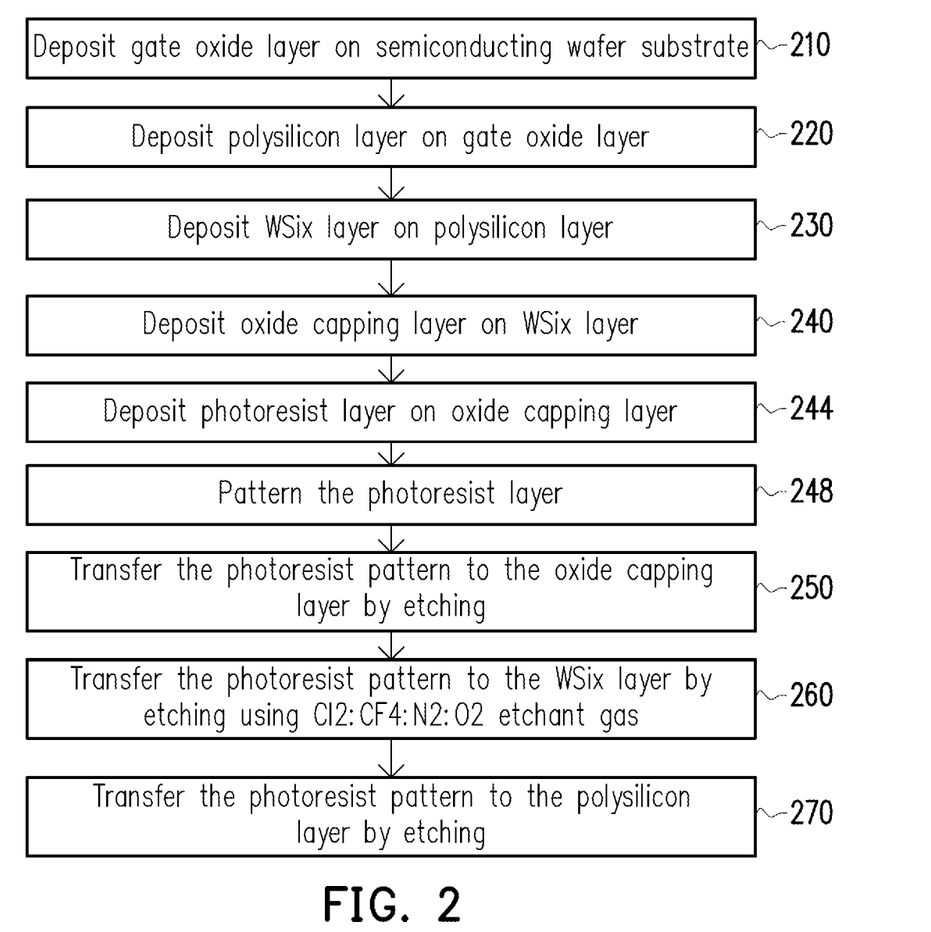
FIG. 2 is a flow chart illustrating a method for making a gate electrode for a transistor, in accordance with some embodiments.

FIG. 2 is a flow chart illustrating a method for making a gate electrode for a transistor. Some of the method steps are also illustrated in FIGS. 1A-1E.

In step 210, a gate oxide layer is deposited on a semiconducting wafer substrate. In step 220, a polysilicon layer is deposited on the gate oxide layer. In step 230, a tungsten silicide (WSix) layer is deposited on the polysilicon layer. In step 240, an oxide capping layer is deposited on the WSix layer. In step 244, a photoresist layer is deposited on the oxide capping layer. In step 248, the photoresist layer is patterned. The result of these steps is illustrated in FIG. 1A.

In step 250, the pattern in the photoresist layer is transferred to the oxide capping layer. A pattern is thus formed in the oxide capping layer. As mentioned above, this may be done via dry etching using plasma treatment with a combination of gases such as $CF_4$, $CHF_3$, and $O_2$. The result of this step is shown in FIG. 1B.

In step 260, the pattern in the photoresist layer carries through and is formed in the WSix layer. As mentioned above, this may be done via dry etching using plasma treatment with a combination of $Cl_2$, $CF_4$, $N_2$, and $O_2$ gases. The result of this step is shown in FIG. 1C.

In step 270, the pattern in the photoresist layer carries through and is formed in the polysilicon layer. As mentioned above, this may be done via dry etching using plasma treatment with a combination of a combination of HBr, $Cl_2$, and $HeO_2$ gases. The result of this step is shown in FIG. 1D and FIG. 1E.

Referring to step 260, the addition of oxygen gas ($O_2$) to the etchant gas for the WSix layer, as well as an increase in the relative amount of nitrogen gas ($N_2$) in the etchant gas, increases the selectivity of the etchant gas for WS ix compared to polysilicon. The relative amount of chlorine gas ($Cl_2$) in the etchant gas is also decreased. As a result, the polysilicon layer is etched less during the WSix overetch step. This in turn reduces overetching during the polysilicon etch step, which in turn reduces etching through the gate oxide layer and into the substrate, causing damage. In addition, because the WSix layer is typically very thick, overetching of the polysilicon layer can result in necking in the polysilicon layer (i.e. the walls of the polysilicon layer are not vertical). Due to the inclusion of $O_2$ in the WSix etchant gas, a more vertical profile can be obtained in the polysilicon layer, as indicated by a greater profile angle. In addition, less of the gate oxide layer is lost during the polysilicon etching step. The thickness of the gate oxide layer is desirably reduced by less than 40 angstroms.

The etchant gas for the WSix layer is a combination of chlorine ($Cl_2$), fluoromethane ($CF_4$), nitrogen ($N_2$), and oxygen ($O_2$) gases. The ratio of these gases to each other may be measured by their flow ratio, which is equivalent to the volume ratio and the molar ratio. In various embodiments, the flow rate of $Cl_2$ may be from about 125 standard cubic centimeters per minute (sccm) to about 135 sccm. The flow rate of $CF_4$ may be from about 35 sccm to about 45 sccm. The flow rate of $N_2$ may be from about 35 sccm to about 45 sccm. The flow rate of $O_2$ may be from about 15 sccm to about 25 sccm.

The flow ratio of $Cl_2$ to $O_2$ may be from about 5:1 to about 9:1. In a specific embodiment, the flow ratio of $Cl_2$ to $O_2$ is about 6.5:1.

The flow ratio of $CF_4$ to $O_2$ may be from about 1.6:1 to about 2.4:1. In a specific embodiment, the flow ratio of $CF_4$ to $O_2$ is about 2:1.

The flow ratio of $N_2$ to $O_2$ may be from about 1.6:1 to about 2.4:1. In a specific embodiment, the flow ratio of $N_2$ to $O_2$ is about 2:1.

The flow ratio of $Cl_2$ to $CF_4$ may be from about 2.7:1 to about 3.9:1. In a specific embodiment, the flow ratio of $Cl_2$ to $CF_4$ is about 3.25:1.

The flow ratio of $Cl_2$ to $N_2$ may be from about 2.7:1 to about 3.9:1. In a specific embodiment, the flow ratio of $Cl_2$ to $N_2$ is about 3.25:1.

The flow ratio of $CF_4$ to $N_2$ may be from about 0.7:1 to about 1.3:1. In a specific embodiment, the flow ratio of $CF_4$ to $N_2$ is about 1:1.

In a first particular embodiment, the flow rate of $N_2$ is from about 35 sccm to about 45 sccm; and the flow rate of $O_2$ is from about 15 sccm to about 25 sccm; and the flow ratio of $N_2$ to $O_2$ is about 1.6:1 to about 2.4:1.

In a second particular embodiment, the flow rate of $N_2$ is from about 35 sccm to about 45 sccm; and the flow rate of $O_2$ is from about 15 sccm to about 25 sccm; and the flow ratio of $N_2$ to $O_2$ is about 2:1.

In a third particular embodiment, the flow ratio of $Cl_2$ to $O_2$ is from about 5:1 to about 9:1; and the flow ratio of $CF_4$ to $O_2$ is from about 1.6:1 to about 2.4:1; and the flow ratio of $N_2$ to $O_2$ is about 1.6:1 to about 2.4:1; and the flow rate of $O_2$ is from about 15 sccm to about 25 sccm.

In a fourth particular embodiment, the flow rate of $Cl_2$ is about 130 sccm; the flow rate of $CF_4$ is about 40 sccm; the flow rate of $N_2$ is about 40 sccm; and the flow rate of $O_2$ is about 20 sccm.

Referring still to step 260 of FIG. 2, where the WSix layer is etched, the WSix layer is usually etched in two steps, a main etch (ME) and an over etch (OE). During the main etch, the majority of etching through the WSix layer occurs. The over etch is used to ensure uniformity of etching over the entire wafer. In particular embodiments, the main etch step for the WSix layer is performed for a time period of about 55 seconds to about 65 seconds. The over etch step for the WSix layer may be performed for a time period of about 15 seconds to about 25 seconds.

Moving now to step 270 of FIG. 2, where the polysilicon layer is etched, the main etch (ME) step for the polysilicon layer is performed for a time period of about 7 seconds to about 15 seconds.

Figure 3:
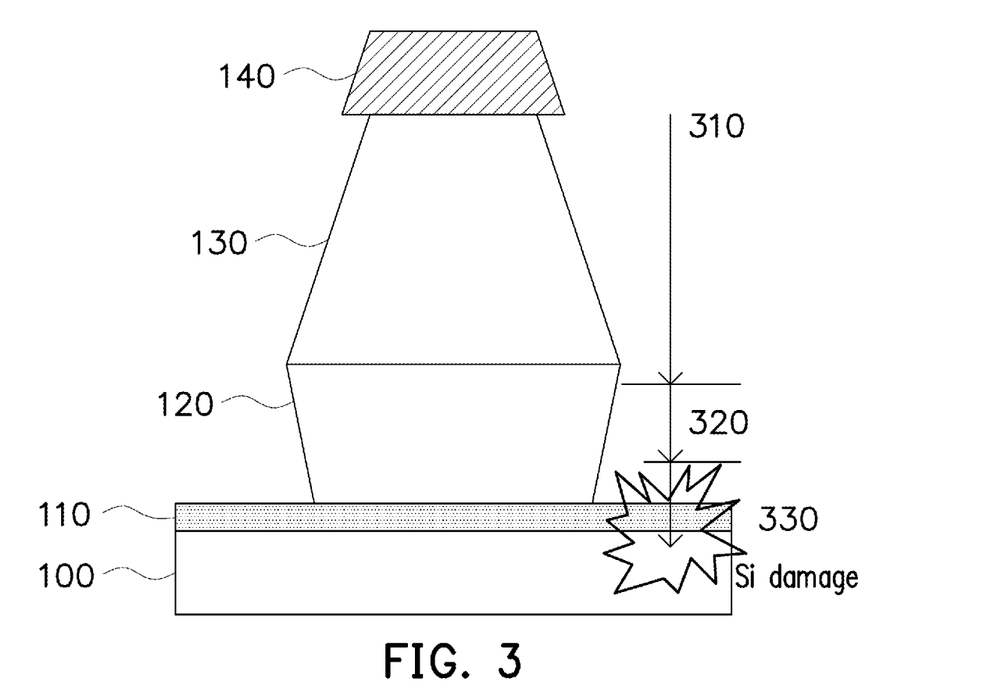
FIG. 3 is a side cross-sectional schematic diagram illustrating a comparative etching process for a gate electrode that illustrates the improvements due to the present disclosure.

FIG. 3 is an illustration of a conventional etching process. The conventional etchant gas for the WSix layer is $Cl_2:CF_4:N_2$ at a flow ratio of 150:40:20. In the conventional etchant gas, the flow ratio of $Cl_2:CF_4$ is 3.75:1, and the flow ratio of $Cl_2:N_2$ is 7.5:1, and the flow ratio of $CF_4:N_2$ is 2:1. The WSix main etch (ME) is indicated with arrow 310, the WSix over etch (OE) is indicated with arrow 320, and the polysilicon ME is indicated with arrow 330. As illustrated here, due to the low selectivity of the $Cl_2:CF_4:N_2$ gas for WSix, the WSix ME and WSix OE would etch both the WSix layer 130 and also etch the majority of the polysilicon layer 120 as well. Thus, the polysilicon ME would etch into the gate oxide layer 110 and possibly damage the substrate 100 as well. The use of the new etchant gas for WSix, which includes oxygen gas and a higher relative amount of nitrogen, reduces the overetching of the polysilicon layer during the WSix layer etching step.

Figure 4:
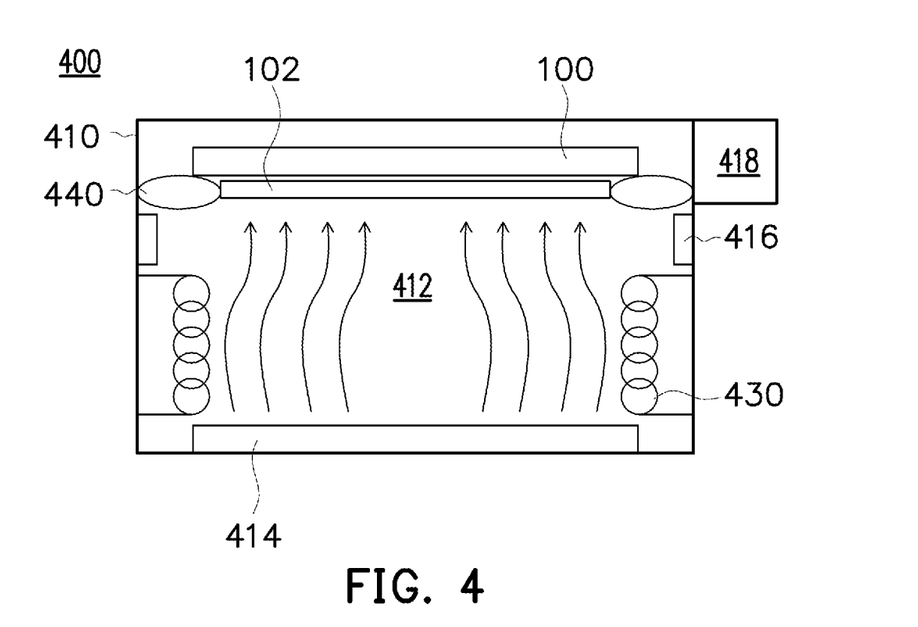
FIG. 4 is a side cross-sectional schematic diagram illustrating one example of a system for performing physical vapor deposition (PVD) or chemical vapor deposition (CVD), for use in the methods described herein.

FIG. 4 is a side cross-sectional schematic diagram illustrating one example of a system for performing physical vapor deposition (PVD) or chemical vapor deposition (CVD). This system may be used for producing any one or all of the gate oxide layer 110, the polysilicon layer 120, the WSix layer 130, and the oxide capping layer 140 as illustrated in FIG. 1A.

The PVD/CVD system 400 includes a housing 410 that defines a reaction chamber 412. The system also includes one or more gas inlets 414, through which process gases are introduced into the internal volume. The gas inlet(s) are connected to gas sources for providing the specified gas. One or more gas outlets 416 is also present for removing undesired gases, and for reducing the pressure within the housing. A gas outlet can be connected to a pump (not shown) for creating vacuum.

The internal volume of the reaction chamber can be heated to maintain the reaction gases in a gaseous state and to enhance reactivity. This may be done, for example, by using resistance heater 430 as illustrated here, or by using one or more heat lamps or other radiant or convective heat sources. These heat sources may be located within the reaction chamber or its walls, or may be located external to the reaction chamber. For example, the walls of the reaction chamber could be made of a transparent heat-retaining material such as quartz.

A substrate holder 440 is located above the gas inlet 416, and the substrate 100 is illustrated as being held by the substrate holder. As illustrated here, the substrate holder contacts the perimeter/periphery of the substrate, to expose as much surface area of the substrate as possible. As desired, shielding material (not shown) can be placed on the substrate to prevent deposition on desired areas. It is noted that while only one substrate holder is illustrated, any number of substrate holders may be present, so that multiple wafer substrates can be treated at a time. Finally, a controller 418 is used to control the various inputs and outputs, and to measure various conditions within the system.

In operation, the chamber is held at very low pressure (i.e. close to vacuum). Appropriate process gases (e.g. $O_2$, $SiH_4$, TEOS, $WF_6$, or other appropriate gases) are provided via gas inlet 414. Heat applied to the chamber by the heater 430 enhances deposition. The process gases rise up and form a layer 102 of the desired material on the substrate 100.

Figure 5:
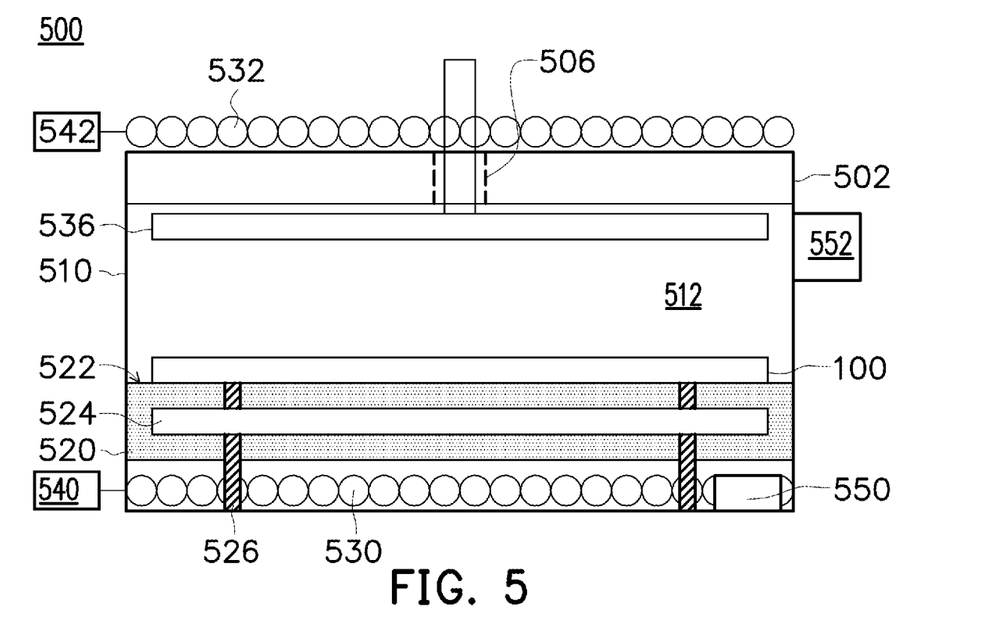
FIG. 5 is a side cross-sectional schematic diagram illustrating another example of a system for performing PVD/CVD or plasma etching, for use in the methods described herein.

FIG. 5 is a side cross-sectional schematic diagram illustrating another example of a system which can also be used for performing plasma-enhanced PVD/CVD, and/or can also be used for plasma etching. The system includes a housing 510 with a reaction chamber 512. A wafer support pedestal 520 is present within the housing. The pedestal may be configured to hold a semiconductor wafer substrate 100 in a desired position. The pedestal 520 includes a support surface 522 which contacts the wafer substrate. The support surface itself is usually made of an electrically insulating material. The semiconducting wafer substrate is placed on the wafer support surface.

In particular embodiments, the pedestal is in the form of an electrostatic chuck that uses an electrostatic holding force to secure the wafer substrate. As illustrated here, the pedestal includes a chuck electrode 524 located below the support surface 522. Extending through the chuck electrode and the support surface are loading pins 526, which can be used to raise and lower the wafer substrate. In some embodiments, channels may be provided on the back side of the electrostatic chuck for providing gases or fluids to cool the wafer substrate during plasma treatment. In this way, warpage and/or other damage to the wafer substrate may be reduced or minimized.

Alternatively, the pedestal may apply vacuum pressure to hold the wafer substrate in place by suction. As yet another alternative, the pedestal may interact mechanically, for example using clamps or retaining rings or the like, to hold the wafer substrate in place using a mechanical holding force.

Continuing, a lower electrode 530 is located below the wafer substrate, and an upper electrode 532 is located above the wafer support pedestal 520. A dielectric window 502 is located between the wafer support pedestal 520 and the upper electrode 532, and physically separates the upper electrode from the interior of the reaction chamber 512. Similarly, the lower electrode 530 may also be isolated from the interior of the reaction chamber. The electrodes may be, for example, in the shape of a planar coil. The electrodes are used to provide energy for ionizing gas molecules so as to generate a plasma.

The system also includes a showerhead 536, through which process gases are introduced into the internal volume. The showerhead and/or gas lines for supplying the process gases pass through a central hole 506 in the dielectric window. The showerhead and/or gas lines are connected to gas sources (not shown) for providing the specified gas. One or more gas outlets 550 is also present for removing undesired gases, and for reducing the pressure within the reaction chamber. A gas outlet can be connected to a pump (not shown) for creating vacuum. A door (not shown) is also present for accessing the reaction chamber, to insert and remove the wafer substrate.

At least one radiofrequency (RF) generator is present for applying RF power. Here, a lower RF generator 540 is coupled to the lower electrode 530, and an upper RF generator 542 is coupled to the upper electrode 532.

A controller 552 is used to control the various inputs and outputs, and to measure various conditions within the housing for the plasma treatment process. The system may also include sensors for monitoring applicable parameters. For example, such sensors may include those for tracking the flow rate of various gases, for measuring the content of gases exiting the chamber, for measuring the pressure within the chamber, the temperature of the wafer substrate, etc. The controller can also determine whether to activate or deactivate the system, how to vary the voltage to the electrodes, how to vary the gas mixture, and potentially also control the motion of any automated handling system that may be present, etc. It is noted that these various parameters may not have to be held steady during operation, and could be changed by the controller operating a computer program which alters their setpoints as appropriate. The controller may also include a user interface for communicating with operators.

The controller 418, 552 of both FIG. 4 and FIG. 5 may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

The various components of these systems may be made using materials and processes known in the art. Examples of suitable materials can include metals, plastics, etc. Common enhancements may also be used. For example, various interior surfaces may include a protective coating.

The system 500 of FIG. 5 can be used for plasma-enhanced PVD/CVD. The plasma can enhance the chemical reaction rate of the precursors. This permits deposition to occur at lower temperatures.

The system 500 of FIG. 5 can also be used to perform plasma etching, as illustrated in FIGS. 1B-1D. The plasma treatment can be performed, for example, as part of a dielectric barrier discharge (DBD) process, a reactive ion etching (RIE) process, or a sequential plasma (SPAB) process. Voltage provided by the RF generators 540, 542 is applied between the upper electrode 532 and the lower electrode 530 to ignite and sustain a plasma. The radiofrequency is usually operated at 13.56 megahertz (MHz), although other frequencies such as 2 MHz or 60 MHz may be used, depending on the application. The power used to generate the plasma may range from about 10 watts (W) to about 2,000 W. Once ignited, the plasma can be sustained by electric currents produced by electromagnetic induction associated with time-varying magnetic fields, or can become self-sustaining.

In some embodiments, the plasma treatment is performed in a vacuum environment, for example with the pressure within the housing being from about 0.1 pascals (Pa) to about 100 Pa. However, the pressure may be higher and could simply be sub-atmospheric, for example a pressure of about 10 kPa to about 95 kPa (for comparison, atmospheric pressure is about 101 kPa).

The etchant gas used for generating the plasma may include one or more gases that enter through the showerhead 536. Depending on the layer being etched, for example, the etchant gases may include one or more of tetrafluoromethane ($CF_4$), trifluoromethane ($CHF_3$), oxygen gas ($O_2$), chlorine gas ($Cl_2$), nitrogen gas ($N_2$), hydrogen bromide (HBr), and helium dioxide ($HeO_2$), and potentially other carrier gases may be used.

The methods of the present disclosure use an etchant gas that has a higher selectivity for the WSix layer compared to the polysilicon layer. In particular embodiments, the selectivity is at least 1.0, and may be as high as 1.7, and in specific embodiments is about 1.57.

The greater selectivity provides greater control over the etching of the various layers when producing a gate electrode. A more vertical profile can be produced in the polysilicon layer, and less necking occurs. Desirably, the profile angle of the polysilicon layer, when measured relative to the gate oxide layer, is from about 88° to 90°. Undercutting of the polysilicon layer is not desired. In this regard, lower profile angles result in a gate electrode structure that is unstable and does not reliably and reproducibly act as expected. In addition, less of the gate oxide layer is lost during the gate electrode etching process. The thickness of the gate oxide layer is desirably reduced by less than 40 angstroms.

In addition, use of the etchant gas can improve some properties of the resulting gate electrode In particular, one measurement made in Wafer Acceptance Tests (WAT) is the property Vt1_TT. When the drain voltage is 12 V, and the source voltage is 0 V, the gate voltage when the drain-to-source current is 0.43 milliamperes (mA) is the Vt1_TT. A higher Vt1_TT is desirable. In particular embodiments, the Vt1_TT of a gate electrode produced using an etchant gas containing $Cl_2:CF_4:N_2:O_2$ is at least 1.2V. In other embodiments, the Vt1_TT of a gate electrode produced using an etchant gas containing $Cl_2:CF_4:N_2:O_2$ is at least 3% higher than the Vt1_TT of a gate electrode produced using an etchant gas containing $Cl_2:CF_4:N_2$, and not containing oxygen.

Some embodiments of the present disclosure thus relate to methods for etching a tungsten silicide layer. The tungsten silicide layer is exposed to an etchant gas comprising $Cl_2$, $CF_4$, $N_2$, and $O_2$.

Some other embodiments of the present disclosure relate to alternative methods for etching a tungsten silicide layer. The tungsten silicide layer is exposed to an etchant gas comprising $N_2:O_2$ in a flow ratio of about 1.6:1 to about 2.4:1.

Other embodiments of the present disclosure relate to methods of forming a gate electrode in a transistor. A gate oxide layer is deposited on a semiconducting wafer substrate. A polysilicon layer is deposited on the gate oxide layer. A tungsten silicide (WSix) layer is deposited on the polysilicon layer. A TEOS oxide layer is deposited on the tungsten silicide layer. A pattern is formed in the TEOS oxide layer. The tungsten silicide layer is then etched using an etchant gas comprising $Cl_2$, $CF_4$, $N_2$, and $O_2$. The polysilicon layer is then etched using an etchant gas comprising HBr, $Cl_2$, and $HeO_2$.

The methods and systems of the present disclosure are further illustrated in the following non-limiting working example, it being understood that the example is intended to be illustrative only and that the disclosure is not intended to be limited to the materials, conditions, process parameters and the like recited herein.

EXAMPLE

Gate electrode structures were made as illustrated in FIGS. 1A-1D. The etchant gas for the WSix layer was changed between the Comparative Example and the Inventive Example. The etchant gas for the Comparative Example did not contain oxygen ($O_2$), whereas oxygen was present in the etchant gas for the Inventive Example. The etchant gas for the polysilicon layer was the same in both Examples.

The etch rate, uniformity, and the WSix to polysilicon selectivity were measured. The uniformity was measured by measuring the thickness of 49 different transistors on the same die, and then calculated as: Uniformity=[(Max thickness−min thickness)/(2×average thickness)].

The etchant gas formulae and the results are shown in the following table:

|  | Comparative Example | Inventive Example |
|---|---|---|
| Etchant gas $Cl_2$ (sccm) | 150 | 130 |
| Etchant gas $CF_4$ (sccm) | 40 | 40 |
| Etchant gas $N_2$ (sccm) | 20 | 40 |
| Etchant gas $O_2$ (sccm) | 0 | 20 |
| Mean WSix etch rate (angstroms/min) | 2507.7 | 2934.2 |
| WSix uniformity (%) | 10.3 | 11.8 |
| Mean polysilicon etch rate (angstroms/min) | 3057.6 | 1871.3 |
| polysilicon uniformity (%) | 6.7 | 7.8 |
| Selectivity | 0.82 | 1.57 |

As seen in this table, the selectivity of the etchant gas for the WSix layer was much higher when oxygen gas ($O_2$) was included. Indeed, the etchant gas for the WSix layer in the Comparative Example actually etched more of the polysilicon layer than of the WSix layer. In addition, the relative amount of nitrogen in the Comparative Example is about 9.5 mole %, compared to about 17.4 mole % in the Inventive Example. The relative amount of chlorine in the Comparative Example is about 71.4 mole %, compared to about 56.5 mole % in the Inventive Example.

Figure 6:
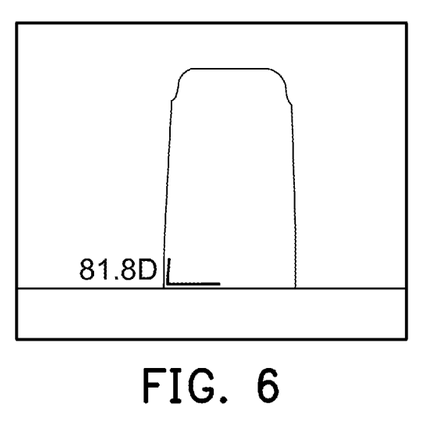
FIG. 6 is an illustration of a gate electrode formed in the Comparative Example.
Figure 7:
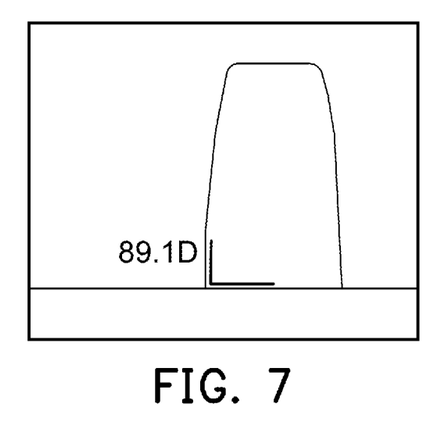
FIG. 7 is an illustration of a gate electrode formed in the Comparative Example.

FIG. 6 is an illustration of one gate electrode formed in the Comparative Example. FIG. 7 is an illustration of one gate electrode formed in the Comparative Example. As seen here, the profile angle of the polysilicon layer in the Comparative Example is 81.8 degrees, whereas the profile angle in the Inventive Example is 89.1 degrees, which is a much more vertical profile. In addition, the loss of thickness in the gate oxide layer in the Comparative Example was more than 60 angstroms, compared to a loss of less than 40 angstroms in the Inventive Example.

Figure 8:
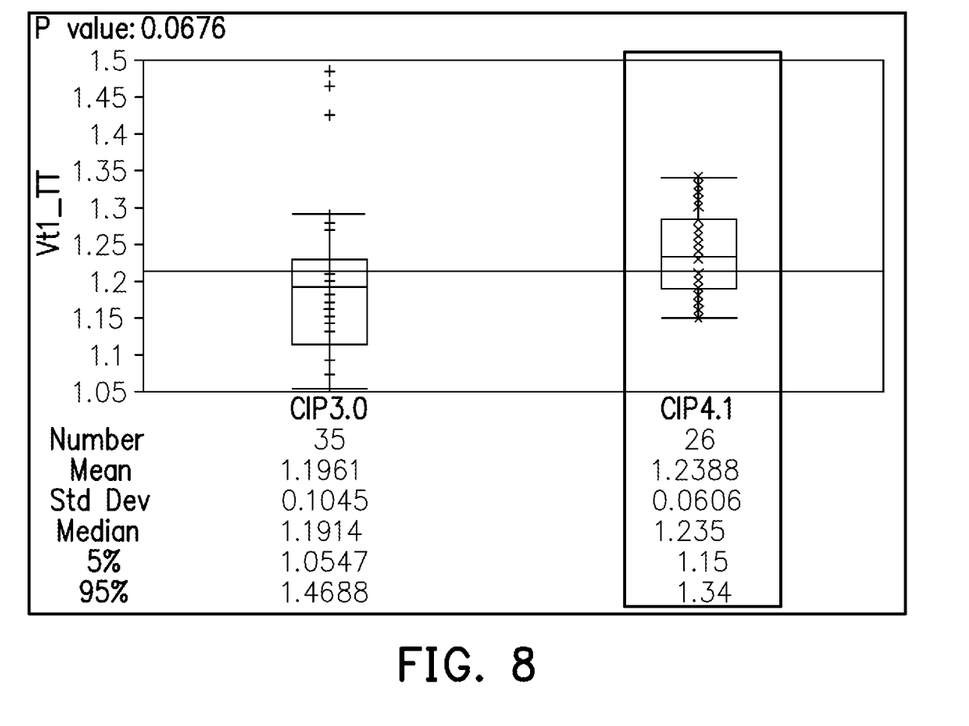
FIG. 8 is a graph showing the Wafer Acceptance Test (WAT) improvement between the Comparative Example and the Inventive Example for the property Vt1_TT.

FIG. 8 is a graph showing the Wafer Acceptance Test (WAT) improvement between the Comparative Example and the Inventive Example for the property Vt1_TT. The Comparative Example is labeled CIP3.0, and the Inventive Example is labeled CIP4.1. As seen in this graph, the mean Vt1_TT changes from 1.1961 V to 1.2388 V, which is an improvement of about 3.5%. In addition, the standard deviation is lower for the Inventive Example, and the median value is higher for the Inventive Example. The variation between high and low values is also much lower for the Inventive Example.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for etching a tungsten silicide layer in a gate electrode, comprising:

etching the tungsten silicide layer using an etchant gas comprising $Cl_2$, $CF_4$, $N_2$, and $O_2$;

wherein the flow of $Cl_2$ is from about 125 sccm to about 135 sccm;

wherein the flow of $CF_4$ is from about 35 sccm to about 45 sccm;

wherein the flow of $N_2$ is from about 35 sccm to about 45 sccm; and wherein the flow of $O_2$ is from about 15 sccm to about 25 sccm;

wherein a flow ratio of $Cl_2:N_2$ is from about 2.7:1 to about 3.9:1; and wherein a flow ratio of $CF_4$ to $O_2$ is from about 1.6:1 to about 2.4:1.

2. The method of claim 1, wherein the flow ratio of $N_2:O_2$ is from about 1.6:1 to about 2.4:1.

3. The method of claim 1, wherein the flow ratio of $Cl_2:CF_4$ is from about 2.7:1 to about 3.9:1.

4. The method of claim 1, wherein the flow ratio of $Cl_2:O_2$ is from about 5:1 to about 9:1.

5. A method for etching a tungsten silicide layer in a gate electrode, comprising:

etching the tungsten silicide layer using an etchant gas comprising $Cl_2$, $CF_4$, $N_2$, and $O_2$;

wherein the flow of $Cl_2$ is from about 125 sccm to about 135 sccm;

wherein the flow of $CF_4$ is from about 35 sccm to about 45 sccm;

wherein the flow of $N_2$ is from about 35 sccm to about 45 sccm;

wherein the flow of $O_2$ is from about 15 sccm to about 25 sccm;

wherein a flow ratio of $Cl_2:N_2$ is from about 2.7:1 to about 3.9:1;

wherein a flow ratio of $CF_4$ to $O_2$ is from about 1.6:1 to about 2.4:1; and wherein a flow ratio of $N_2:O_2$ is from about 1.6:1 to about 2.4:1.

6. The method of claim 5, wherein the flow ratio of $Cl_2:CF_4$ is from about 2.7:1 to about 3.9:1.

7. The method of claim 5, wherein the flow ratio of $Cl_2:O_2$ is from about 5:1 to about 9:1.

8. A method of forming a gate electrode in a transistor, comprising:

depositing a gate oxide layer on a semiconducting wafer substrate;

depositing a polysilicon layer on the gate oxide layer;

depositing a tungsten silicide (WSix) layer on the polysilicon layer;

depositing a TEOS oxide layer on the tungsten silicide layer;

forming a pattern in the TEOS oxide layer;

etching the tungsten silicide layer using an etchant gas comprising $Cl_2$, $CF_4$, $N_2$, and $O_2$, wherein the flow of $Cl_2$ is from about 125 sccm to about 135 sccm, the flow of $CF_4$ is from about 35 sccm to about 45 sccm, the flow of $N_2$ is from about 35 sccm to about 45 sccm, the flow of $O_2$ is from about 15 sccm to about 25 sccm, a flow ratio of $Cl_2:N_2$ is from about 2.7:1 to about 3.9:1, and a flow ratio of $CF_4$ to $O_2$ is from about 1.6:1 to about 2.4:1; and etching the polysilicon layer using an etchant gas comprising HBr, $Cl_2$, and $HeO_2$.

9. The method of claim 8, wherein an internal profile angle of the polysilicon layer relative to the gate oxide layer is from about 88 degrees to 90 degrees.

10. The method of claim 8, wherein:
the flow of $N_2$ is about 40 sccm; and
the flow of $O_2$ is about 20 sccm; and
the flow of $Cl_2$ is about 130 sccm; and
the flow of $CF_4$ is about 40 sccm.

11. The method of claim 8, wherein the flow ratio of $Cl_2$ to $O_2$ is from about 5:1 to about 9:1.

12. The method of claim 5, wherein:
the flow of $N_2$ is about 40 sccm; and
the flow of $O_2$ is about 20 sccm; and
the flow of $Cl_2$ is about 130 sccm; and
the flow of $CF_4$ is about 40 sccm.

13. The method of claim 1, wherein a flow ratio of $CF_4:N_2$ is from about 0.7:1 to about 1.3:1.

14. The method of claim 1, wherein:
the flow of $N_2$ is about 40 sccm; and
the flow of $O_2$ is about 20 sccm; and
the flow of $Cl_2$ is about 130 sccm; and
the flow of $CF_4$ is about 40 sccm.

15. The method of claim 5, wherein a flow ratio of $CF_4:N_2$ is from about 0.7:1 to about 1.3:1.

16. The method of claim 8, wherein a flow ratio of $CF_4:N_2$ is from about 0.7:1 to about 1.3:1.

17. The method of claim 8, wherein a flow ratio of $Cl_2:CF_4$ is from about 2.7:1 to about 3.9:1.

18. The method of claim 8, wherein a flow ratio of $N_2$ to $O_2$ is from about 1.6:1 to about 2.4:1.

19. The method of claim 1, wherein the etching of the tungsten silicide layer is done in a main etch step and an over etch step.

20. The method of claim 19, wherein the main etch step is performed for a time period of about 55 seconds to about 65 seconds; and wherein the over etch step is performed for a time period of about 15 seconds to about 25 seconds.

* * * * *